(12) United States Patent
Nakagawasai et al.

(10) Patent No.: US 12,167,542 B2
(45) Date of Patent: Dec. 10, 2024

(54) METHOD FOR MANUFACTURING SUBSTRATE WITH SENSOR

(71) Applicant: TOKYO ELECTRON LIMITED, Tokyo (JP)

(72) Inventors: Manabu Nakagawasai, Tokyo (JP); Motoi Yamagata, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 470 days.

(21) Appl. No.: 17/521,563

(22) Filed: Nov. 8, 2021

(65) Prior Publication Data

US 2022/0151078 A1 May 12, 2022

(30) Foreign Application Priority Data

Nov. 9, 2020 (JP) ................ 2020-186544

(51) Int. Cl.
*H05K 3/30* (2006.01)
*H01L 21/67* (2006.01)
*G01K 1/14* (2021.01)

(52) U.S. Cl.
CPC ....... *H05K 3/305* (2013.01); *H01L 21/67248* (2013.01); *G01K 1/14* (2013.01); *H05K 2203/0147* (2013.01); *H05K 2203/104* (2013.01)

(58) Field of Classification Search
CPC ........... H05K 3/305; H05K 2203/0147; H05K 2203/104; H01L 21/67248; G01K 1/14
See application file for complete search history.

(56) References Cited

FOREIGN PATENT DOCUMENTS

JP H02-12840 A 1/1990
JP 2000-058406 A 2/2000

OTHER PUBLICATIONS

Machine translation of JP 6647647 B1; Publication date: Feb. 14, 2020; Inventor: Kurokawa Akira.*
Machine translation of JP 62242400 A; Publication date: Oct. 22, 1987; Inventor: Sumita Makoto.*

* cited by examiner

*Primary Examiner* — Vishal I Patel
(74) *Attorney, Agent, or Firm* — Fenwick & West LLP

(57) ABSTRACT

There is provided a method for manufacturing a substrate with a sensor in which a sensor is disposed on a plate-shaped substrate. The method comprises: holding the sensor by a magnetic force from a position on an opposite surface of a surface of the plate-shaped substrate on which the sensor is disposed that corresponds to a position where the sensor is fixed; and fixing the sensor to the plate-shaped substrate by curing an adhesive attached to the sensor in a state where the sensor is held by the magnetic force.

9 Claims, 4 Drawing Sheets

METHOD FOR MANUFACTURING SUBSTRATE WITH SENSOR

CROSS-REFERENCE TO RELATED APPLICATIONS

This application claims priority to Japanese Patent Application No. 2020-186544, filed on Nov. 9, 2020, the entire contents of which are incorporated herein by reference.

TECHNICAL FIELD

The present disclosure relates to a method for manufacturing a substrate with a sensor.

BACKGROUND

For example, Japanese Patent Application Publication No. 2000-58406 suggests a temperature measuring device of a plate-shaped body, which is manufactured by forming a concave portion for embedding a temperature detecting part of a thermocouple in a plate-shaped body, and filling and hardening an adhesive material in a state where the temperature detecting part of the thermocouple is inserted in the concave portion. In the temperature measuring device disclosed in Japanese Patent Application Publication No. 2000-58406, a recess is formed at one or multiple locations on a side surface of the concave portion to protrude more outwardly than a rim at an upper end opening of the concave portion. The temperature detecting part of the thermocouple is inserted into the concave portion of the plate-shaped body, and the adhesive material is filled in the concave portion. Accordingly, the adhesive material is also filled in the recess, and the adhesive material filled and hardened in the recess prevents the adhesive material from coming out from the concave portion of the plate-shaped body.

SUMMARY

The present disclosure provides a method for manufacturing a substrate with a sensor that can accurately position sensors on a substrate with a sensor.

In accordance with an aspect of the present disclosure, there is provided a method for manufacturing a substrate with a sensor in which a sensor is disposed on a plate-shaped substrate. The method comprises: holding the sensor by a magnetic force from a position on an opposite surface of a surface of the plate-shaped substrate on which the sensor is disposed that corresponds to a position where the sensor is fixed; and fixing the sensor to the plate-shaped substrate by curing an adhesive attached to the sensor in a state where the sensor is held by the magnetic force.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
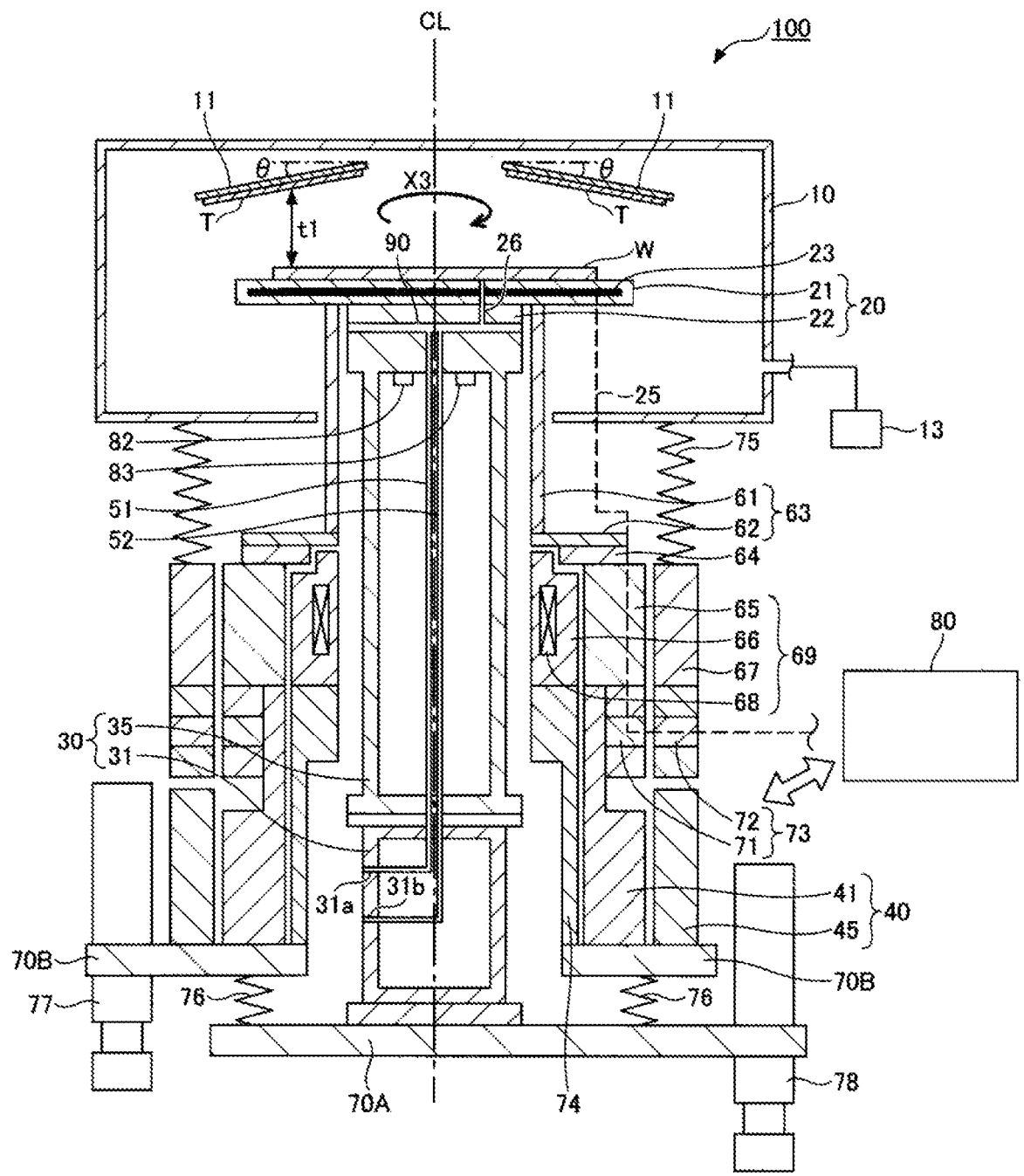
FIG. 1 is a schematic cross-sectional view showing an example of a substrate processing apparatus according to an embodiment.

Hereinafter, an embodiment of the present disclosure will be described in detail with reference to the accompanying drawings. Like reference numerals will be given to like or corresponding parts throughout the drawings, and redundant description thereof may be omitted.

(Substrate Processing Apparatus)

First, an example of a substrate processing apparatus according to an embodiment of the present disclosure will be described with reference to FIG. 1. FIG. 1 is a vertical cross-sectional view showing an example of the substrate processing apparatus according to the embodiment. A substrate processing apparatus 100 shown in FIG. 1 is an apparatus for performing desired processing on a substrate W such as a semiconductor wafer as a substrate to be processed in a vacuum processing chamber 10 where a vacuum atmosphere is generated and substrate processing is performed using a processing gas. The substrate processing apparatus is a physical vapor deposition (PVD) apparatus.

The substrate processing apparatus 100 includes the vacuum processing chamber 10, a substrate support 20, a freezing device 30, a rotating device 40, a first elevating device 77, and a second elevating device 78. The substrate support 20 places thereon the substrate W in the vacuum processing chamber 10. The rotating device 40 rotates the substrate support 20. The first elevating device 77 raises and lowers the substrate support 20. The second elevating device 78 raises and lowers the freezing device 30. The substrate processing apparatus 100 further includes a controller 80 for controlling various devices such as the freezing device 30, the first elevating device 77, and the like. The substrate processing apparatus 100 of the illustrated example includes two elevating devices, i.e., the first elevating device 77 for raising and lowering the substrate support 20, and the second elevating device 78 for raising and lowering the freezing device 30. However, the substrate support 20 and the freezing device 30 may be raised and lowered by a common elevating device.

The substrate support 20 is disposed at an inner lower space of the vacuum processing chamber 10, and a plurality of target holders 11 is disposed above the substrate support 20 while being fixed with a predetermined inclination angle θ with respect to the horizontal plane. Further, different types of targets T are attached to a bottom surface of each target holder 11. The inclination angle θ may be 0°. In other words, the target holders 11 may be fixed horizontally.

The vacuum processing chamber 10 is configured such that a pressure therein can be reduced to a vacuum level by operating an exhaust device 13 such as a vacuum pump or the like. A processing gas (e.g., nitrogen ($N_2$) gas or a noble gas such as argon (Ar), krypton (Kr), neon (Ne), or the like) required for sputtering film formation is supplied from a processing gas supply device (not shown) to the vacuum processing chamber 10.

An AC voltage or a DC voltage is applied from a power supply for plasma generation (not shown) to the target holders 11. When an AC voltage is applied from the power supply for plasma generation to the target holders 11 and the target T, plasma is generated in the vacuum processing chamber 10, and the noble gas or the like in the vacuum processing chamber 10 is ionized. The target T is sputtered by the ionized noble gas elements or the like. Atoms or molecules of the sputtered target T are deposited on the surface of the substrate W held on the substrate support 20 while facing the target T.

Since the target T is inclined with respect to the substrate W, incident angles of the particles sputtered from the target T on the substrate W can be adjusted, and in-plane uniformity of a thickness of a film such as a magnetic film formed on the substrate W or the like can be improved. Even when each target holder 11 has the same inclination angle θ in the vacuum processing chamber 10, the incident angles of the sputtered particles with respect to the substrate W can be changed by adjusting a distance t1 between the target T and the substrate W by raising and lowering the substrate support 20. Accordingly, the substrate support 20 is controlled to move up and down so that the distance t1 suitable for each target T is set for each target T to be applied.

Although the number of targets T is not particularly limited, from the viewpoint that different films made of different materials can be sequentially formed by one substrate processing apparatus 100, it is preferable that a plurality of different targets T are present inside the vacuum processing chamber 10.

The freezing device 30 includes a chiller 31 and a heat transfer gas container 35, and has a structure in which the heat transfer gas container 35 is stacked on the chiller 31. The substrate support 20 is disposed above the heat transfer gas container 35 of the freezing device 30 with a gap 90 interposed therebetween. The chiller 31 holds the heat transfer gas container 35, and can cool the upper surface of the heat transfer gas container 35 to an extremely low temperature of −30° C. or lower, e.g., about −200° C. The chiller 31 preferably uses a Gifford-McHahon (GM) cycle in view of cooling performance.

The heat transfer gas container 35 is fixed on the chiller 31, and an upper portion of the heat transfer gas container 35 is accommodated in the vacuum processing chamber 10. The heat transfer gas container 35 is made of copper (Cu) or the like having high thermal conductivity, and has a substantially cylindrical outer shape. The heat transfer gas container 35 is disposed such that the center thereof coincides with a central axis CL of the substrate support 20.

A coolant supply channel 51 (example of a coolant channel) and a coolant discharge channel 52 (example of a coolant channel) are disposed in the heat transfer gas container 35 and the chiller 31. The coolant supply channel 51 supplies a coolant that is a heat transfer gas to the gap 90 between the heat transfer gas container 35 and the substrate support 20. The coolant discharge channel 52 discharges the coolant having a temperature increased by heat transfer from the substrate support 20.

Further, the coolant supply channel 51 and the coolant discharge channel 52 are fixed to connection fixing portions 31a and 31b on a wall surface of the chiller 31, respectively. The coolant is supplied from a coolant supply device (not shown), flows through the coolant supply channel 51, and is supplied to the gap 90. As the coolant supplied to the gap 90 to cool the substrate support 20, helium (He) gas having high thermal conductivity is preferably used.

The substrate support 20 has a structure in which a first plate 21 on which the substrate W is placed is laminated on the upper side and a second plate 22 is laminated on the lower side. Both plates are made of copper (Cu) having high thermal conductivity. The first plate 21 includes an electrostatic chuck having a chuck electrode 23 embedded in a dielectric film. A predetermined potential is applied to the chuck electrode 23 through a wiring 25. With this configuration, the substrate W can be attracted to the electrostatic chuck and the substrate W can be fixed to the upper surface of the substrate support 20. The substrate support 20 does not necessarily have the laminated structure of the first plate 21 and the second plate 22. Instead, the substrate support 20 may be a single plate, or may be integrally molded by sintering or the like.

The substrate support 20 has a through-hole 26 vertically penetrating through the first plate 21 and the second plate 22. The through-hole 26 communicates with the gap 90 disposed below the substrate support 20, and the coolant supplied to the gap 90 is supplied between the upper surface of the substrate support 20 (electrostatic chuck) and a bottom surface of the substrate W through the through-hole 26. Accordingly, it is possible to efficiently transfer cold and heat of the coolant and the heat transfer gas container 35 to the substrate W.

On the other hand, the coolant discharged from the gap 90 flows through the coolant discharge channel 52 and is discharged to a coolant discharge device (not shown). The coolant supply channel 51 and the coolant discharge channel 52 may be the same channel.

With this configuration, the substrate support 20 can be cooled to an extremely low temperature by supplying the coolant to the gap 90 through the coolant supply channel 51. Thermal grease having good thermal conductivity may be used as the coolant, instead of the cooling gas. By adjusting the temperature of the coolant, the substrate support 20 can be adjusted to a desired temperature.

In the example of FIG. 1, the coolant flowing through the coolant supply channel 51 is supplied to the bottom surface of the substrate W through the through-hole 26, and the coolant discharged through the through-hole 26 flows through the coolant discharge channel 52 and is discharged. However, the coolant may be supplied and discharged in a different manner. For example, the through-hole 26 may be provided with an independent coolant channel different from the coolant supply channel 51 and the coolant discharge channel 52, and the coolant from the through-hole 26 can be supplied or discharged through the independent coolant channel.

The substrate support 20 is supported by an outer cylinder 63. The outer cylinder 63 is disposed to cover an outer peripheral surface of the upper portion of the heat transfer gas container 35. An upper portion of the outer cylinder 63 enters the vacuum processing chamber 10 and supports the substrate support 20 in the vacuum processing chamber 10. The outer cylinder 63 has a cylindrical portion 61 whose inner diameter is slightly greater than an outer diameter of the heat transfer gas container 35, and a flange portion 62 extending outward on a bottom surface of the cylindrical portion 61. The cylindrical portion 61 directly supports the substrate support 20. The cylindrical portion 61 and the flange portion 62 are made of a metal such as stainless steel or the like.

A heat insulating member 64 is connected to a bottom surface of the flange portion 62. The heat insulating member 64 has a substantially cylindrical shape extending coaxially with the flange portion 62, and is fixed to the bottom surface of the flange portion 62. The heat insulating member 64 is made of ceramics such as alumina or the like. A magnetic fluid sealing portion 69 is disposed on a bottom surface of the heat insulating member 64.

The magnetic fluid sealing portion 69 includes a rotating portion 65, an inner fixing portion 66, an outer fixing portion 67, and a heating source 68. The rotating portion 65 has a substantially cylindrical shape extending coaxially with the heat insulating member 64, and is fixed to the bottom surface of the heat insulating member 64. In other words, the rotating portion 65 is connected to the outer cylinder 63 with the heat insulating member 64 interposed therebetween. With this configuration, the transfer of cold and heat of the outer cylinder 63 to the rotating portion 65 is blocked by the heat insulating member 64, which makes it possible to suppress the deterioration of the sealing performance or the occurrence of condensation due to the decrease in the temperature of the magnetic fluid of the magnetic fluid sealing portion 69.

The inner fixing portion 66 is disposed between the heat transfer gas container 35 and the rotating portion 65, and there is the magnetic fluid between the inner fixing portion 66 and the rotating portion 65. The inner fixing portion 66 is formed in a substantially cylindrical shape having an inner diameter greater than an outer diameter of the heat transfer gas container 35 and having an outer diameter smaller than an inner diameter of the rotating portion 65. The outer fixing portion 67 is disposed outside the rotating portion 65 via the magnetic fluid. The outer fixing portion 67 is formed in a substantially cylindrical shape having an inner diameter greater than an outer diameter of the rotating portion 65. The heating source 68 is embedded in the inner fixing portion 66 and heats the entire magnetic fluid sealing portion 69. With this configuration, it is possible to suppress the deterioration of the sealing performance or the occurrence of condensation due to the decrease in the temperature of the magnetic fluid of the magnetic fluid sealing portion 69. With these configurations, in the magnetic fluid sealing portion 69, the rotating portion 65 is rotatable with respect to the inner fixing portion 66 and the outer fixing portion 67 in an airtight state. In other words, the outer cylinder 63 is rotatably supported via the magnetic fluid sealing portion 69.

A substantially cylindrical bellows 75 is disposed between an upper surface of the outer fixing portion 67 and a bottom surface of the vacuum processing chamber 10. The bellows 75 is a metal bellows structure that can be expanded and contracted in a vertical direction. The bellows 75 surrounds an upper portion of the heat transfer gas container 35, a lower portion of the outer cylinder 63, and the heat insulating member 64, and separates an inner space of the vacuum processing chamber 10 that can be decompressed and an outer space of the vacuum processing chamber 10.

A slip ring 73 is disposed below the magnetic fluid sealing portion 69. The slip ring 73 has a rotating body 71 including a metal ring and a fixed body 72 including a brush. The rotating body 71 has a substantially cylindrical shape extending coaxially with the rotating portion 65 of the magnetic fluid sealing portion 69, and is fixed to a bottom surface of the rotating portion 65. The fixed body 72 is formed in a substantially cylindrical shape having an inner diameter slightly larger than an outer diameter of the rotating body 71. The slip ring 73 is electrically connected to a DC power supply (not shown), and supplies a power supplied from the DC power supply to the wiring 25 via the brush of the fixed body 72 and the metal ring of the rotating body 71. With this configuration, it is possible to apply a potential to the chuck electrode from the DC power supply without causing torsion or the like in the wiring 25. The rotating body 71 constituting the slip ring 73 is attached to the rotating device 40. The slip ring may have a structure other than a brush structure, e.g., a non-contact power supply structure, a structure having a mercury-free liquid or a conductive liquid, or the like.

The rotating device 40 is a direct drive motor having a rotor 41 and a stator 45. The rotor 41 has a substantially cylindrical shape extending coaxially with the rotating body 71 of the slip ring 73, and is fixed to the rotating body 71. The stator 45 is formed in a substantially cylindrical shape having an inner diameter greater than an outer diameter of the rotor 41. With this configuration, when the rotor 41 rotates, the rotating body 71, the rotating portion 65, the outer cylinder 63, and the substrate support 20 rotate in a X3 direction with respect to the heat transfer gas container 35. The rotating device is not necessarily the direct drive motor, and may include a servomotor and a transmission belt.

A heat insulating body 74 having a vacuum insulation double structure is disposed around the chiller 31 and the heat transfer gas container 35. In the illustrated example, the heat insulating body 74 is disposed between the chiller 31 and the rotor 41 and between a portion below the heat transfer gas container 35 and the rotor 41. With this configuration, the transfer of cold and heat of the chiller 31 and the heat transfer gas container 35 to the rotor 41 can be suppressed.

The chiller 31 is fixed to an upper surface of a first support 70A that is vertically movably attached to the second elevating device 78. On the other hand, the rotating device 40 and the heat insulating body 74 are fixed to an upper surface of a second support 70B that is vertically movably attached to the first elevating device 77. A substantially cylindrical bellows 76 surrounding the chiller 31 is disposed between the upper surface of the first support 70A and a bottom surface of the second support 70B. Similarly to the bellows 75, the bellows 76 is a metal bellows structure that can be expanded and contracted in the vertical direction.

A second cooling gas supply unit (not shown) for supplying a cooling gas (e.g., a second cooling gas) different from the cooling gas (e.g., a first cooling gas) flowing through the coolant supply channel 51 may be disposed around the chiller 31 and the heat transfer gas container 35. The second cooling gas supply unit supplies the second cooling gas to the space between the heat transfer gas container 35 and the outer cylinder 63. The second cooling gas has thermal conductivity different from that of the first cooling gas flowing through the coolant supply channel 51, and preferably has relatively low thermal conductivity. Therefore, the second cooling gas has a relatively high temperature compared to that of the first cooling gas flowing through the coolant supply channel 51. Accordingly, it is possible to prevent the first cooling gas leaking from the gap 90 into a side space from entering the magnetic fluid sealing portion 69. In other words, the second cooling gas functions as a counterflow to the first cooling gas leaking from the gap 90. With this configuration, it is possible to suppress the deterioration of the sealing performance or the occurrence of condensation due to the decrease in the temperature of the magnetic fluid of the magnetic fluid sealing portion 69. Further, it is preferable that a supply pressure of the second cooling gas supplied from the second cooling gas supply unit is substantially the same as or slightly higher than a supply pressure of the first cooling gas flowing through the coolant supply channel 51 in order to enhance the function as the counterflow. As the second cooling gas, a low boiling point gas such as argon gas, neon, or the like may be used.

A temperature sensor 82 for detecting a temperature of the gap 90 or the like and a pressure sensor 83 for detecting a pressure of the gap 90 or the like are disposed above the heat transfer gas container 35. As the temperature sensor 82, it is possible to use, e.g., a silicon diode temperature sensor or a low temperature sensor such as a platinum resistance temperature sensor or the like. The data measured by the temperature sensor 82 and the pressure sensor 83 are transmitted to the controller 80 at any time.

Among the components of the substrate processing apparatus 100, the freezing device 30 is configured to be raised and lowered by the second elevating device 78, and the components other than the freezing device 30 and the processing chamber 10 are configured to be raised and lowered by the first elevating device 77.

The changes in the gap 90 between the substrate support 20 and the heat transfer gas container 35 can be avoided by raising and lowering the freezing device 30 using the second elevating device 78. Specifically, the heat transfer gas container 35 is contracted by about several millimeters due to its cold and heat, so that the height (or width) of the gap 90 may be changed. When the heat transfer gas container 35 is thermally contracted with respect to the substrate support 20 fixed at a predetermined height and the gap 90 is changed in a film forming process, the vertical movement of the freezing device 30 is precisely controlled by the second elevating device 78. With this control, it is possible to avoid the changes in the gap 90 and to continue the film forming process while maintaining the initial gap 90.

The distance t1 between the target T and the substrate W can be adjusted by raising and lowering the substrate support 20 in the vacuum processing chamber 10 using the first elevating device 77. The distance t1 is appropriately adjusted depending on the type of the target T. When the substrate support 20 is raised and lowered to adjust the distance t1, the controller 80 performs synchronous control of the first elevating device 77 and the second elevating device 78. Since the controller 80 performs the synchronous control of the first elevating device 77 and the second elevating device 78, it is possible to control the vertical movement of both the substrate support 20 and the freezing device 30 while maintaining the initial gap 90.

The controller 80 is a computer. The controller 80 includes a central processing unit (CPU), a main storage device, an auxiliary storage device, an input/output interface, and a communication interface that are connected to each other by a connection bus. The main storage device and the auxiliary storage device are computer-readable recording media.

The CPU controls the entire controller 80. For example, the CPU provides a function that meets a predetermined purpose by executably developing a program stored in the auxiliary storage device in a work area of the main storage device and controlling peripheral devices by executing the program. The main storage device stores a computer program executed by the CPU, data processed by the CPU, or the like. The main storage device includes, e.g., a flash memory, a random access memory (RAM), or a read only memory (ROM). The auxiliary storage device stores various programs and various data in a readable/writable storage medium. The auxiliary storage device is a disk including a non-volatile semiconductor memory, a hard disk drive (HDD) device, a solid state drive device, or the like. Further, the auxiliary storage device may be a removable recording medium such as a CD, a DVD, a BD, a universal serial bus (USB) memory, a secure digital (SD) memory card, or the like. The communication interface is an interface for a network connected to the controller 80. The input/output interface is an interface for inputting/outputting data to/from a device connected to the controller 80. The input/output interface is, e.g., a keyboard, a touch panel, or the like. The controller 80 receives an operation instruction or the like from an operator of the input device through the input/output interface.

The controller 80 controls the operation of various peripheral devices. The peripheral devices include a coolant supply device 201, the freezing device 30, the rotating device 40, the first elevating device 77, the second elevating device 78, and the like.

The controller 80 maintains the height of the gap 90 in the initial state by controlling the vertical movement of the second elevating device 78. Accordingly, it is possible to continue the film forming process while controlling the substrate W to a desired temperature. Further, the controller 80 performs synchronous control of the first elevating device 77 and the second elevating device 78. Due to the synchronous control, the substrate support 20 (and the upper portion of the freezing device 30) is raised and lowered in the vacuum processing chamber 10 while maintaining the initial gap 90, and the distance t1 between the target T and the substrate W is adjusted to a desired level.

(Temperature Measurement in an Extremely Low Temperature Environment)

In the substrate processing apparatus 100 configured as described above, a plate-shaped substrate with a sensor is used to measure a temperature of the substrate support 20. For example, a substrate with a sensor is used for creating a temperature profile showing temperatures of different locations on the substrate W that is used for checking whether or not the substrate support 20 is controlled to an extremely low temperature (about −200° C. or lower) during the processing of the substrate. The temperature profile is used for controlling the temperature of the substrate support 20 (the temperature of the substrate W) during the processing the substrate W. The substrate with a sensor is used for maintenance of the substrate processing apparatus 100, assembly of the substrate processing apparatus 100, evaluation of the substrate processing apparatus 100, or the like. The substrate with a sensor is placed on the substrate support 20, and the temperature of the substrate support 20 (i.e., the temperature of the substrate W on the substrate support 20) is measured.

As one of the variability factors of the temperature measurement in an extremely low temperature environment near −200° C. or lower, it is conceivable that there may be variations in temperature measurement due to variations in the fixed positions of multiple temperature sensors disposed on the substrate with a sensor. In addition, the variation in the temperature measurement may be caused when heat input control is not performed at wiring portions connected to the temperature sensors.

Therefore, a method for manufacturing the substrate with a sensor, which can accurately position temperature sensors disposed on the substrate with a sensor, is provided. Further, a method for manufacturing the substrate with a sensor, which can control heat input at the wiring portions connected to the temperature sensors, is provided. Accordingly, it is possible to eliminate the variation in the temperature measurement in an extremely low temperature environment and perform accurate temperature measurement. Hereinafter, an example of the configuration of the plate-shaped substrate with a sensor will be described and, then, a method for manufacturing the substrate with a sensor will be described.

(Plate-Shaped Substrate with Sensor)

Figure 2:
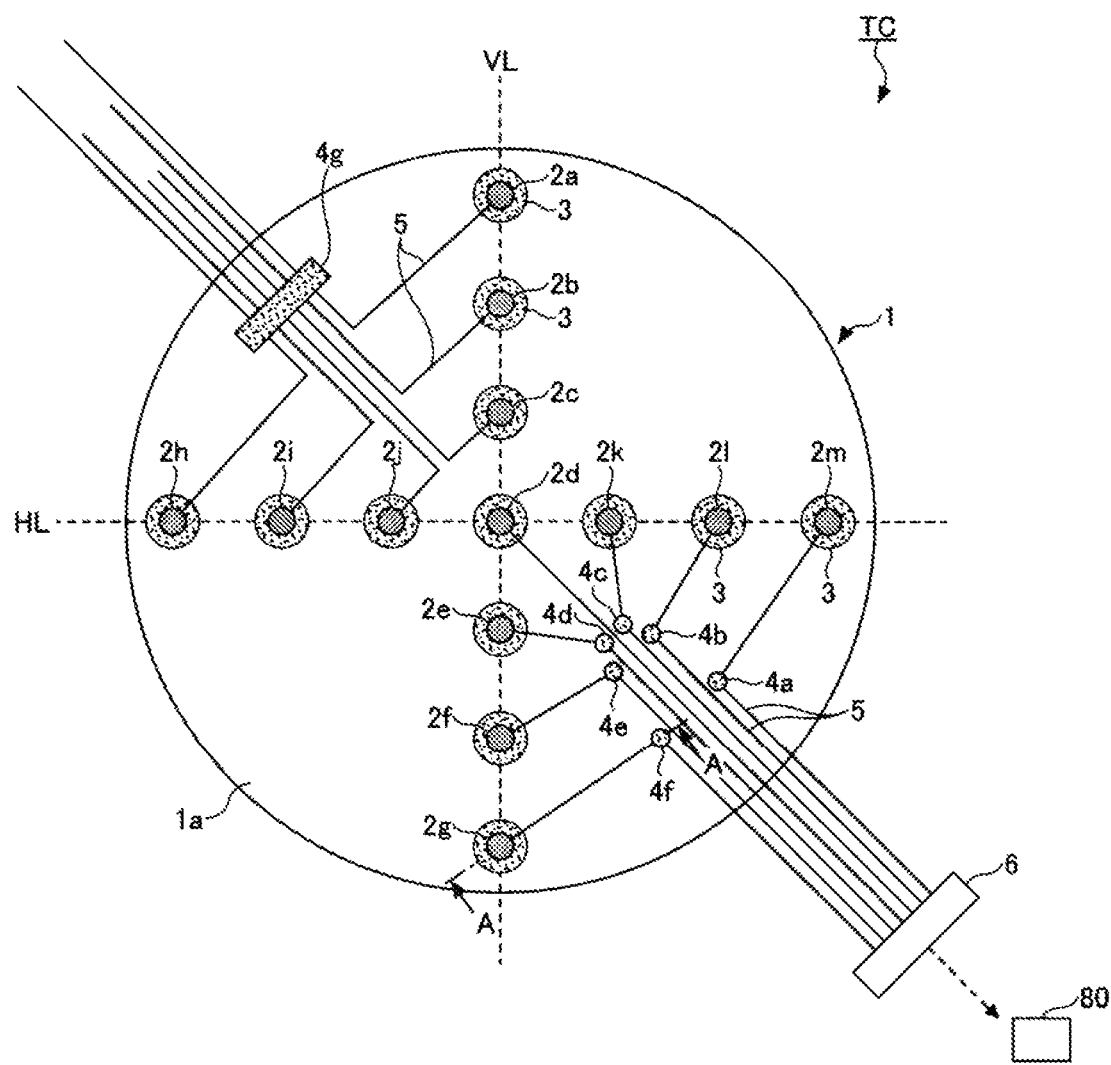
FIG. 2 shows an example of a substrate with a sensor according to the embodiment.
Figure 3:
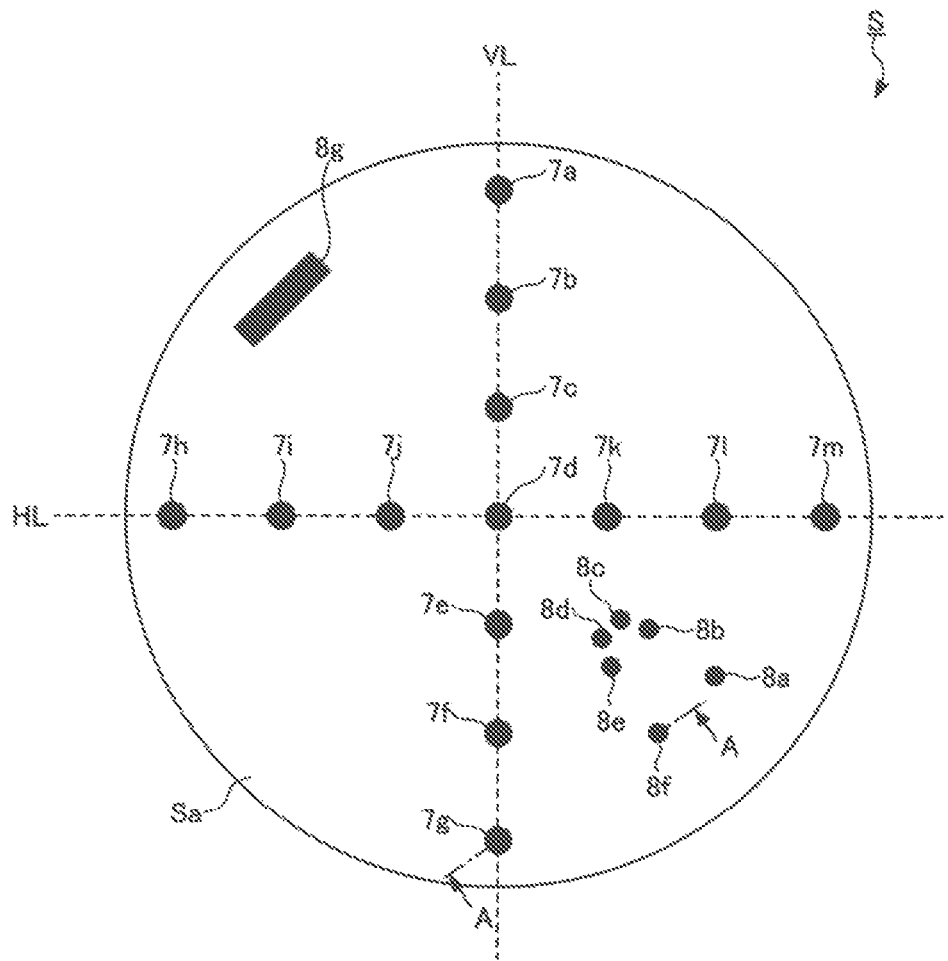
FIG. 3 shows an example of a stage used for manufacturing a substrate TC with sensors according to the embodiment.

An example of a configuration of a plate-shaped substrate TC with a sensor will be described with reference to FIGS. 2 and 3. FIG. 2 shows an example of the substrate TC with a sensor according to the embodiment. FIG. 3 shows an example of a stage S on which the substrate TC with a sensor is placed at the time of manufacturing the substrate TC with a sensor according to the embodiment.

The substrate TC with a sensor (hereinafter, also referred to as "substrate TC") according to the embodiment of the present disclosure is a plate-shaped body and has a circular base 1. Similarly to the substrate W, the base 1 is preferably formed in a circular shape or a square shape so that it can be held and transferred by an arm of a transfer device. The base 1 is made of a material capable of penetrating a magnetic force, such as silicon, AlTiC, glass, or the like.

The substrate TC has a plurality of temperature sensors 2a to 2m for measuring the temperature of the substrate support 20 on a front surface 1a of the base 1. Hereinafter, the temperature sensors 2a to 2m are collectively referred to as "temperature sensor 2." Thirteen temperature sensors 2a to 2m are arranged at equal intervals on a vertical axis VL and a horizontal axis HL passing through the center of the circular base 1.

The temperature sensor 2 is made of a magnetic material. The temperature sensor 2 capable of measuring a temperature close to −200° C. (e.g., −150° C. to −220° C.) or lower may be made of platinum cobalt (platinum resistor: Pt—Co) that is a kind of an alloy magnet. The temperature sensor 2 capable of measuring a temperature close to −200° C. may be made of a material that is attracted by a magnetic force, such as alumel (K type thermocouple) containing a nickel (Ni)-based alloy, a gold iron type (AF type thermocouple), or the like. The temperature sensor 2 measures the temperature of the substrate support 20. The temperature sensor 2 may include a component capable of outputting a resistance value for measuring the temperature.

The temperature sensor 2 may be disposed on the surface of the plate-shaped base 1. Alternatively, grooves may be formed on the base 1, and the temperature sensor 2 may be disposed on the grooves. Each temperature sensor 2 is fixed to the base 1 by adhering an adhesive 3 from the top of each temperature sensor 2 and curing the adhesive 3. The adhesive 3 may be made of ceramic that is excellent in heat resistance and insulating properties and can be used in vacuum, an insulating material such as a resin containing an epoxy-based component that is compatible with an extremely low temperature, or the like.

Lead wires 5 are connected to each temperature sensor 2. The lead wires 5 are made of a nickel-based material that causes magnetic reaction or a clad material obtained by performing nickel treatment on platinum (Pt). The lead wires 5 are made of a magnetic material. The lead wires 5 transmit a temperature measurement signal indicating temperature information measured by each temperature sensor 2 to the controller 80 through a hermetic connection terminal 6. The hermetic connection terminal 6 electrically connects the lead wires 5 and the controller 80 through a conductive terminal. The hermetic connection terminal 6 may have a function of maintaining airtightness in the vacuum processing chamber 10.

Thermal anchor fixing points 4a to 4g for fixing the lead wires 5 to the base 1 are formed by applying an adhesive to the positions where the lead wires 5 are fixed as thermal anchors and curing the adhesive.

Similarly to the adhesive 3, the adhesive used for the thermal anchor fixing points 4a to 4g is made of a ceramic that is excellent in heat resistance and insulating properties and can be used in vacuum or an insulating material such as a resin containing an epoxy-based component that is compatible with an extremely low temperature. Each of the thermal anchor fixing points 4a to 4f fixes one lead wire 5 to the base 1. A thermal anchor fixing point 4g collectively fixes multiple lead wires 5 to the base 1. The thermal anchor fixing points 4a to 4g may be collectively referred to as "thermal anchor fixing point 4."

By extending the lead wires 5 as the thermal anchors near the temperature sensors and fixing the lead wires 5 to the base 1 at the thermal anchor fixing points 4a to 4g, the temperatures of the substrate support 20 as a measurement target and the lead wires 5 can be substantially the same. Accordingly, the heat input from the lead wires 5 to the temperature sensor 2 can be removed, which makes it possible to perform more accurate temperature measurement using the temperature sensor 2.

The temperature sensor 2 and the lead wires 5 of the substrate TC with a sensor according to the embodiment of the present disclosure are made of a magnetic material. Using their property, magnets 7a to 7m and magnets 8a to 8g are arranged on a placement surface Sa of the stage S on which the substrate TC is placed in manufacturing the substrate TC with a sensor, as shown in FIG. 3. The magnets 7a to 7m and the magnets 8a to 8g may be collectively referred to as "magnet 7" and "magnet 8", respectively.

The positions of the magnets 7a to 7m are specific positions on the placement surface Sa corresponding to the positions where the temperature sensors 2a to 2m are disposed on the front surface 1a of the base 1, and thirteen magnets are arranged at equal intervals on the vertical axis VL and the horizontal axis HL passing through the center of the circular stage S.

Similarly, the positions of the magnets 8a to 8f are specific positions on the placement surface Sa corresponding to the positions where the thermal anchor fixing points 4a to 4f for fixing the lead wires 5 to the base 1 are disposed.

The position of the magnet 8g is a specific position on the placement surface Sa corresponding to the position where the thermal anchor fixing point 4g for collectively fixing the plurality of lead wires 5 to the base 1 are disposed.
(Positioning of Sensor)

Figure 4:
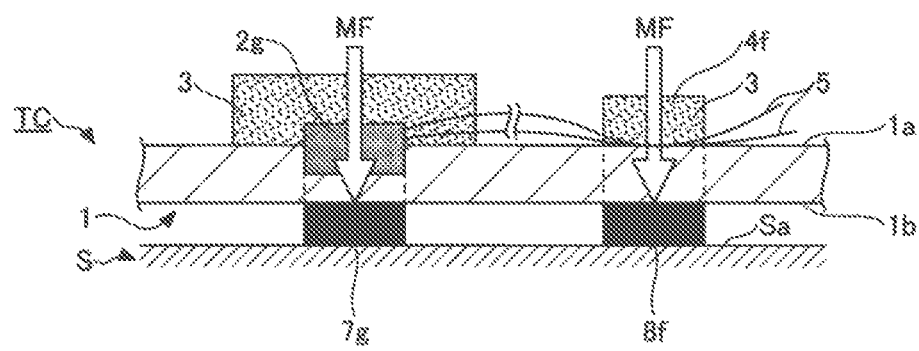
FIG. 4 shows a cross section taken along a line IV-IV of FIGS. 2 and 3.

An example of positioning the temperature sensor 2 and the thermal anchor fixing point 4 will be described with reference to FIG. 4 showing IV-IV cross section of FIGS. 2 and 3. The temperature sensor 2g disposed on the front surface 1a of the base 1 of the substrate TC with a sensor is made of a magnetic material. The magnets 7a to 7m and the magnets 8a to 8g are examples of a magnetic force generator.

The temperature sensor 2g can be attracted to the magnet 7g by a magnetic force MF of the magnet 7g disposed on the placement surface Sa. Accordingly, the temperature sensor 2g can be positioned at the same position as the position of the magnet 7g in the XY direction, and the temperature sensor 2g is held at the position on the front surface 1a of the base 1 perpendicular to the position of the magnet 7g in the Z direction.

Similarly, at the thermal anchor fixing point 4f, the lead wire 5 on the magnet 8f can be attracted to the magnet 8f by the magnetic force MF of the magnet 8f. Accordingly, the lead wire 5 can be positioned at the same position as the position of the magnet 8f in the X-Y direction, and the lead wire 5 is held at the position on the front surface 1a of the base 1 perpendicular to the position of the magnet 8f in the Z direction.

Similarly, the other temperature sensors 2 and the thermal anchor fixing points 4 can be positioned at the positions on the placement surface Sa corresponding to the positions where the temperature sensors 2 and the thermal anchor fixing points 4 should be fixed at the same time by the magnetic force of the magnets 7 and 8. In this manner, the magnets 7 and 8 are used to position the temperature sensor 2 and the thermal anchor fixing point 4 from a back surface 1b side of the base 1.

In a state where the temperature sensor 2 and the thermal anchor fixing point 4 are positioned, the adhesive 3 is adhered from the top of the temperature sensor 2 and the thermal anchor fixing point 4, and the adhered adhesive 3 is cured to fix the temperature sensor 2 and the thermal anchor fixing point 4 to the base 1. The curing of the adhesive 3 may or may not require heating and/or cooling.

(Method for Manufacturing Substrate with Sensor)

Figure 5:
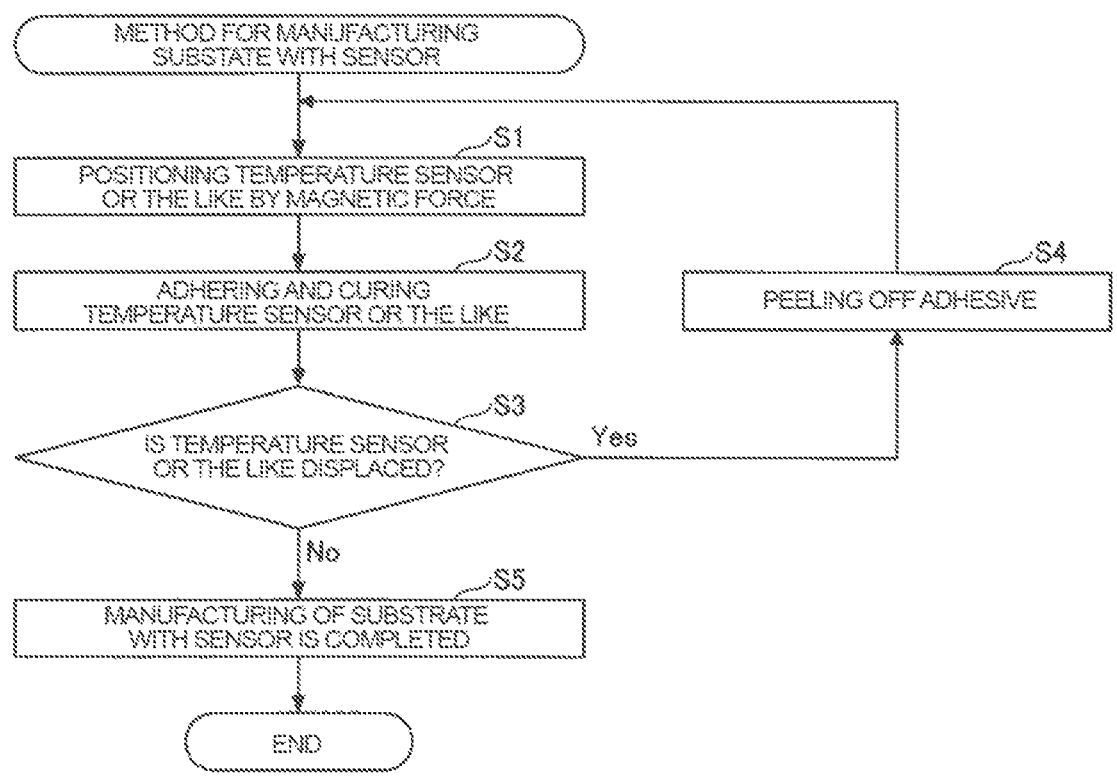
FIG. 5 is a flowchart showing an example of a method for manufacturing the substrate with a sensor according to the embodiment.

Next, a method for manufacturing the substrate TC with a sensor according to the embodiment of the present disclosure will be described with reference to FIG. 5. FIG. 5 is a flowchart showing an example of a method for manufacturing the substrate TC with a sensor according to the embodiment.

In the method for manufacturing the substrate TC with a sensor, the substrate TC with a sensor is disposed on the placement surface Sa of the stage S with magnets of FIG. 3 that is located in an atmospheric environment. The temperature sensor 2 and the lead wires 5 located at the positions where the thermal anchors are fixed are attracted by the magnetic force of the magnets 7a to 7m and the magnets 8a to 8g disposed on the placement surface Sa. Accordingly, the temperature sensors 2a to 2m are positioned on the front surface 1a of the base 1 at the same positions in the X-Y direction as the positions of the magnets 7a to 7m, and the lead wires 5 are positioned on the front surface 1a of the base 1 at the same positions in the X-Y direction as the positions of the magnets 8a to 8g (step S1).

Next, in a state where the temperature sensor 2 and the like are positioned, the adhesive 3 is adhered and cured on the temperature sensors 2a to 2m and on the lead wires 5 of the thermal anchor fixing points 4a to 4g (step S2). Accordingly, the temperature sensors 2a to 2m are fixed at specific positions on the base 1. Further, the lead wires 5 are fixed on the base 1 by the thermal anchor fixing points 4a to 4g.

Next, it is determined whether or not at least one of the positions of the fixed temperature sensors 2a to 2m and the thermal anchor fixing points 4a to 4g is displaced from the position where it should be fixed (step S3). When it is determined that the temperature sensor 2 or the like are displaced, the adhesive fixing the displaced temperature sensor 2 or the displaced thermal anchor fixing point 4 is peeled off (step S4). Then, the step of holding and positioning the temperature sensor 2 or the like by the magnetic force of the magnet (step S1) and the step of curing the adhesive 3 and fixing the temperature sensor and the like to the base 1 (step S2) are executed again.

When it is determined in step S3 that there is no positional displacement in all the temperature sensors 2 and all the thermal anchor fixing points 4, the manufacturing of the substrate TC with a sensor is completed (step S5).

In the method for manufacturing the substrate TC with a sensor according to the present disclosure, in the completed substrate TC with a sensor, platinum cobalt (Pt—Co) is used for the temperature sensor 2 for measuring a temperature of −200° C. or lower, and alumel (K type thermocouple) containing an Ni-based alloy or a gold iron type (AF type thermocouple) is used for the temperature sensor 2 for measuring a temperature close to −200° C. Since platinum cobalt, K-type thermocouple, and AF-type thermocouple are magnetic materials, the temperature sensor 2 and the like are attracted by the magnetic force of the magnet 7 from the back surface side of the base 1, and the temperature sensor 2 is positioned at the position on the base 1 corresponding to the position of the magnet. Accordingly, it is possible to eliminate the variation in the positions of the temperature sensors 2 arranged on the base 1 and accurately position the temperature sensors 2 arranged on the substrate TC with a sensor. This makes it possible to improve the accuracy of temperature measurement in an extremely low temperature environment close to −200° C. or lower.

In the same manner, the variation in the positions of the thermal anchor fixing points 4a to 4g can be eliminated, so that the thermal anchor fixing points 4a to 4g can be accurately positioned on the substrate TC with a sensor. Accordingly, the heat input can be controlled at the wiring portion connected to the temperature sensor 2, which makes it possible to suppress the variation in the temperature measurement and improve the temperature measurement accuracy.

In the case of measuring the temperature of the substrate support 20 using the completed substrate TC with a sensor, the substrate TC is attracted to the electrostatic chuck of the substrate support 20 and then, the multiple temperature sensors arranged on the substrate TC measure the temperatures of the substrate support 20 at the positions where the temperature sensors are arranged.

Modification

When a plate-shaped body that does not penetrate the magnetic force is used for the base 1, a magnetic film having a magnetic property may be processed and used for the base 1. In this case, an adhesive base material that is partially attached to the base 1 may also be used. In this case, the temperature sensor 2 and the like are attracted to and held by the magnetic film having a magnetic property, so that the magnet may be unnecessary.

The sensor to be attached to the substrate TC with a sensor is not limited to a sensor for temperature measurement, and may be any sensor that can be attached to the substrate TC, such as a pressure sensor, a vibration system sensor, or the like.

It is also possible to apply a wireless sensor without lead wires to the substrate TC.

The sensor is not necessarily formed on the front surface of the base 1, and may be formed on either the front surface 1a or the back surface 1b. The magnet is located on the surface opposite to the surface on which the sensor is located to position the sensor.

The temperature sensor 2 may be a magnetic thin film resistance temperature detector element. Since the thin film resistance temperature detector element has good temperature responsiveness, it is possible to improve the measurement accuracy of the temperature close to −200° C. (e.g., −150° C. to −220° C.).

Sensor information such as the resistance value outputted by the temperature sensor 2 (in this case, the temperature is derived from the resistance value in the case of platinum cobalt) is transmitted to the controller 80 through the lead wire by the hermetic connection terminal or a compensating lead wire. Since, however, the connection using the lead wire may cause temperature variation, an analog value of the resistance value may be transmitted wirelessly, instead of using the lead wire.

As described above, in accordance with the method for manufacturing the substrate with a sensor of the present embodiment, it is possible to accurately position the sensors on the substrate with a sensor.

The method for manufacturing the substrate with a sensor according to the embodiment of the present disclosure is considered to be illustrative in all respects and not restrictive. The above-described embodiments can be changed and modified in various forms without departing from the scope of the appended claims and the gist thereof. The above-described embodiments may include other configurations without contradicting each other and may be combined without contradicting each other.

The substrate processing apparatus of the present disclosure may be applied to any type of apparatus such as an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus, a helicon wave plasma (HWP) apparatus.

Further, the substrate processing apparatus is not limited to the film forming apparatus, and may be any processing apparatus that performs predetermined processing (e.g., etching or the like) on the substrate. It may be a plasma processing apparatus or a non-plasma processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for manufacturing a substrate with a sensor in which a sensor is disposed on a plate-shaped substrate which does not penetrate a magnetic force, comprising:
    holding the sensor by a magnetic force from a position on an opposite surface of a surface of the plate-shaped substrate on which the sensor is disposed that corresponds to a position where the sensor is fixed; and
    fixing the sensor to the plate-shaped substrate by curing an adhesive attached to the sensor in a state where the sensor is held by the magnetic force,
    wherein holding the sensor includes holding the sensor by the magnetic force from a magnetic film which is disposed on the position on the opposite surface that corresponds to the position where the sensor is fixed.

2. The method of claim 1, wherein in said holding the sensor, the sensor is held by a magnetic force of a magnetic force generator disposed on the position on the opposite surface that corresponds to the position where the sensor is fixed.

3. The method of claim 2, wherein in said holding the sensor, multiple sensors on the plate-shaped substrate are simultaneously held by the magnetic force of multiple magnetic force generators disposed on multiple positions on the opposite surface that correspond to multiple positions where the multiple sensors are fixed.

4. The method of claim 1, wherein when the position of the sensor fixed to the plate-shaped substrate is displaced from the position where the sensor is desired to be fixed, said holding the sensor and said fixing the sensor to the plate-shaped substrate are executed again after the adhesive fixing the sensor is peeled off.

5. The method of claim 1, wherein the sensor is made of a magnetic material.

6. The method of claim 1, further comprising:
    holding a lead wire by a magnetic force from a position on the opposite surface that corresponds to a position where the lead wire on the plate-shaped substrate connected to the sensor is fixed as a thermal anchor; and
    fixing the lead wire to the plate-shaped substrate by curing an adhesive attached to the lead wire in a state where the lead wire is held by the magnetic force.

7. The method of claim 6, wherein in said holding the lead wire, multiple lead wires on the plate-shaped substrate are simultaneously held by a magnetic force of multiple magnetic force generators disposed on multiple positions on the opposite surface that correspond to multiple positions where the multiple lead wires are fixed.

8. The method of claim 7, wherein in said holding the lead wire, the multiple lead wires on the plate-shaped substrate are collectively held by the magnetic force of the magnetic force generator disposed on a position on the opposite surface that corresponds to a position where the multiple lead wires are fixed collectively.

9. The method of claim 6, wherein the lead wire is made of a magnetic material.

* * * * *